United States Patent
Schmid et al.

(10) Patent No.: US 8,394,203 B2
(45) Date of Patent: Mar. 12, 2013

(54) IN-SITU CLEANING OF AN IMPRINT LITHOGRAPHY TOOL

(75) Inventors: Gerard M. Schmid, Austin, TX (US); Ian Matthew McMackin, Austin, TX (US); Byung-Jin Choi, Austin, TX (US); Douglas J. Resnick, Leander, TX (US)

(73) Assignee: Molecular Imprints, Inc., Austin, TX (US)

( * ) Notice: Subject to any disclaimer, the term of this patent is extended or adjusted under 35 U.S.C. 154(b) by 583 days.

(21) Appl. No.: 12/563,356

(22) Filed: Sep. 21, 2009

(65) Prior Publication Data
US 2010/0085555 A1   Apr. 8, 2010

Related U.S. Application Data

(60) Provisional application No. 61/182,912, filed on Jun. 1, 2009, provisional application No. 61/102,082, filed on Oct. 2, 2008.

(51) Int. Cl.
*B08B 5/00* (2006.01)
(52) U.S. Cl. .......... 134/1; 134/19; 134/21; 134/34; 250/492.1
(58) Field of Classification Search .......... None
See application file for complete search history.

(56) References Cited

U.S. PATENT DOCUMENTS

| | | | |
|---|---|---|---|
| 6,657,384 B1 * | 12/2003 | Niwa | 313/523 |
| 7,832,416 B2 | 11/2010 | Wang et al. | |
| 2005/0112508 A1 * | 5/2005 | Van Schaik et al. | 430/322 |
| 2008/0131623 A1 | 6/2008 | Zhang et al. | |

FOREIGN PATENT DOCUMENTS

| | | |
|---|---|---|
| EP | 0771638 A2 | 5/1997 |
| JP | 2007324504 A | 12/2007 |
| WO | 2005026837 A2 | 3/2005 |
| WO | 2008/045520 A2 | 4/2008 |

OTHER PUBLICATIONS

Machine Translation of WO2005-026837 by Schuster et al., published Mar. 24, 2005.*
PCT/US2009/005307 International Search Report, Nov. 23, 2009.

* cited by examiner

*Primary Examiner* — Michael Kornakov
*Assistant Examiner* — Ryan Coleman
(74) *Attorney, Agent, or Firm* — Cameron A. King

(57) ABSTRACT

Imprint lithography system may provide for an energy source for solidification of material positioned between a template and a substrate. Additionally, the energy source and/or an additional energy source may be used to clean contaminants from the template and/or the substrate.

12 Claims, 8 Drawing Sheets

IN-SITU CLEANING OF AN IMPRINT LITHOGRAPHY TOOL

CROSS-REFERENCE TO RELATED APPLICATIONS

This application claims the benefit under 36 U.S.C. §119 (e)(1) of U.S. Provisional No. 61/102,082, filed on Oct. 2, 2008, and U.S. Provisional No. 61/182,912, filed on Jun. 1, 2009, both of which are hereby incorporated by reference in their entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are herein incorporated by reference.

An imprint lithography technique disclosed in each of the aforementioned U.S. patent publications and patent includes formation of a relief pattern in a polymeric layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is substantially solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

During formation of the relief image into the substrate, as drops of the formable liquid spread to fill the template features, the liquid may flow out of the area between the template and the substrate. Some residual material of the imprinting liquid may remain on the template active area. This material may accumulate with each imprint. This accumulation of material on the template may have deleterious effects on subsequent imprints, including but not limited to: change in critical dimension of the printed features, change in height of printed features, change in the surface energy and/or wetting properties of the template surface, increased adhesion between the solidified layer and the contaminated template surface, and increased numbers of patterning defects in the imprint process.

Techniques for cleaning a template surface include removing the template from the imprint lithography system, cleaning the template, re-installing the template, and inspecting the re-installed template. Cleaning the template may include immersing the template in a liquid cleaning solution or cleaning the template in a reactive plasma chamber. These cleaning processes are slow, resulting in costly down time. Liquid cleaning processes may require elevated temperatures and specialized laboratory equipment. Similarly, plasma cleaning may require a vacuum chamber and high temperatures, and may damage the template surface.

BRIEF DESCRIPTION OF THE DRAWINGS

So that features and advantages may be understood in detail, a more particular description of embodiments may be had by reference to the embodiments illustrated in the drawings. It is to be noted, however, that the drawings only illustrate typical embodiments, and are therefore not to be considered limiting of its scope.

DETAILED DESCRIPTION

Figure 1:
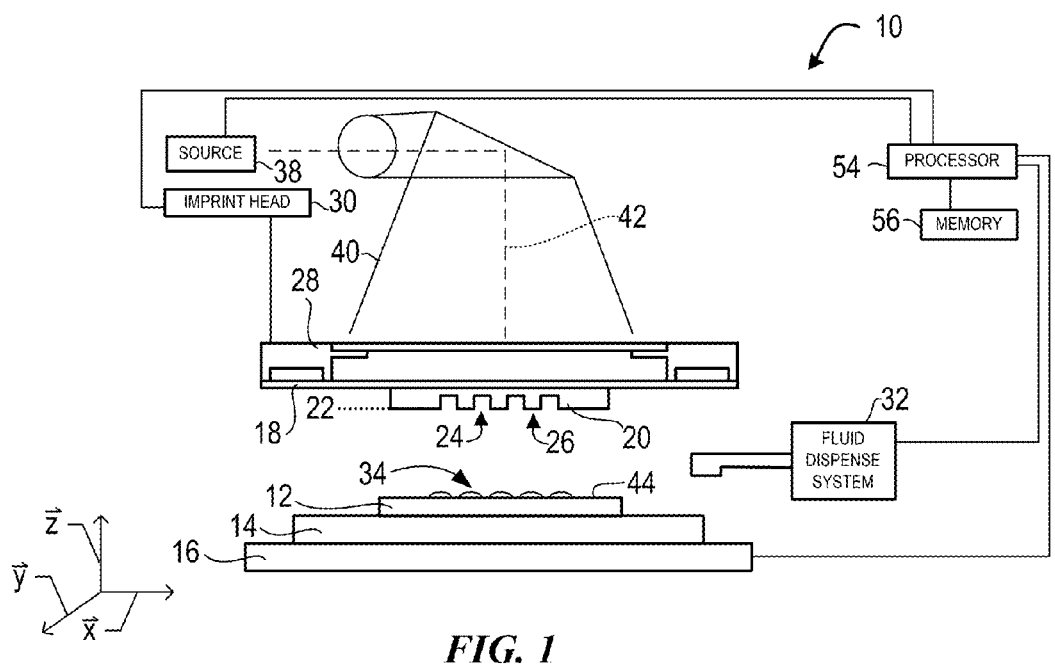
FIG. 1 is a simplified side view of a lithographic system.

Referring to the Figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is herein incorporated by reference.

Substrate 12 and substrate chuck 14 may be further supported by stage 16. Stage 16 may provide motion along the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 includes features defined by a plurality of spaced-apart recesses 24 and/or protrusions 26. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Such chucks are further described in U.S. Pat. No. 6,873,087, which is herein incorporated by reference. Further, chuck 28 may be coupled to imprint head 30 such that chuck 28 and/or imprint head 30 may be configured to facilitate movement of template 18.

System 10 may further include a fluid dispense system 32. Fluid dispense system 32 may be used to deposit materials on substrate 12. For example, fluid dispense system 32 may be used to deposit a formable liquid material 34 on substrate 12. Material 34 may be positioned upon substrate 12 using techniques such as drop dispense, spin-coating, dip coating, chemical vapor deposition (CVD), physical vapor deposition (PVD), thin film deposition, thick film deposition, and/or the like. Material 34 may be disposed upon substrate 12 before and/or after a desired volume is defined between mold 22 and substrate 12 depending on design considerations. Material 34 may include a monomer mixture as described in U.S. Pat. No. 7,157,036 and U.S. Patent Publication No. 2005/0187339, both of which are herein incorporated by reference. Additionally, it should be noted that materials may include functional materials in the biomedical industry, solar cell industry, and the like.

Figure 2:
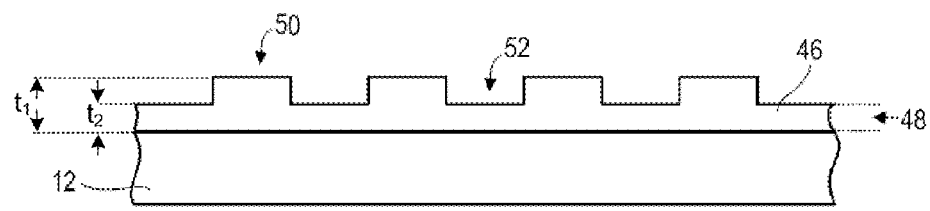
FIG. 2 illustrates a simplified side view of the substrate illustrated in FIG. 1, having a patterned layer thereon.

Referring to FIGS. 1 and 2, system 10 may further include an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38 and may operate on a computer readable program stored in memory 56.

Either imprint head 30, stage 16, or both vary a distance between mold 20 and substrate 12 to define a desired volume therebetween that is filled by material 34. For example, imprint head 30 may apply a force to template 18 such that mold 20 contacts material 34. After the desired volume is filled with material 34, source 38 produces energy 40, e.g. broadband ultraviolet radiation, causing material 34 to solidify and/or cross-link conforming to shape of a surface 44 of substrate 12 and patterning surface 22, defining a patterned layer 46 on substrate 12. Patterned layer 46 may include a residual layer 48 and a plurality of features shown such as protrusions 50 and recessions 52, with protrusions 50 having thickness $t_1$ and residual layer having a thickness $t_2$.

The above-mentioned system and process may be further employed in imprint lithography processes and systems referred to in U.S. Pat. No. 6,932,934, U.S. Pat. No. 7,077,992, U.S. Pat. No. 7,179,396, and U.S. Pat. No. 7,396,475, all of which are herein incorporated by reference in their entirety.

Occasionally, during the imprinting process as described in relation to FIGS. 1 and 2, material 34 may extrude beyond the desired volume between mold 20 and substrate 12. Extrusion beyond the desired volume may be due to fluid pressure generated within material 34 as it is being compressed between mold 20 and substrate 12. Additionally, portions of patterned layer 46 may remain on template 18 even after separation of mold 20 from substrate 12. Remnants of material 34 on patterning surface 22 may cause defects, and are generally referred to herein as contaminants.

In-situ cleaning processes as described herein may be used to clean template 18 without removing template 18 from imprint lithography system 10. Thus, template 18 may be cleaned while the template is still installed in the imprint lithography system 10. Cleaning of template 18 may be achieved quickly at room temperature and atmospheric pressure by implementing a cleaning methodology that is compatible with imprint lithography system 10. Cleaning may be achieved without the use of liquids and/or without damaging surfaces of template 18.

Figure 3:
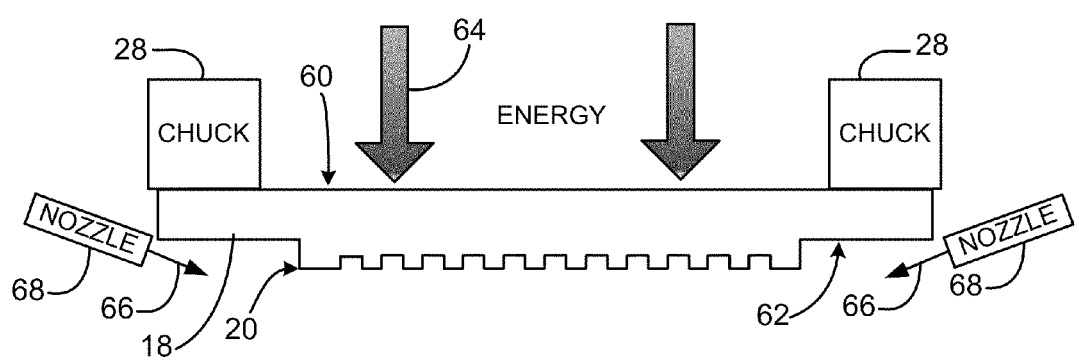
FIG. 3 illustrates a simplified side view of a system for removing contaminants from the template illustrated in FIG. 1.
Figure 4:
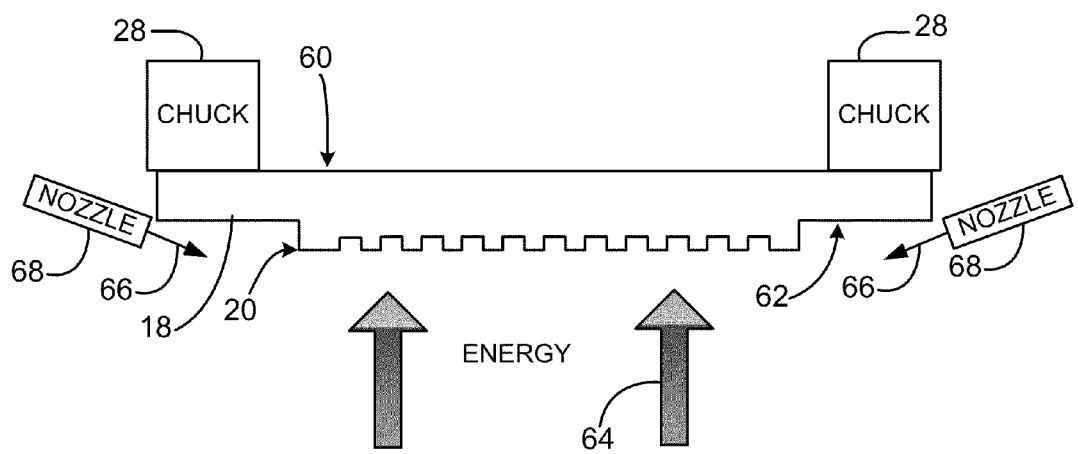
FIG. 4 illustrates a simplified side view of a system for removing contaminants from the template illustrated in FIG. 1.

Referring to FIG. 3, template 18 may include opposing surfaces. For example, template 18 may include back surface 60 and active surface 62. Back surface 60 may include mask 20. Mask 20 may have features 24 and 26 and/or mask 20 may be planar depending on design considerations. In one embodiment, as illustrated in FIG. 3, template 18 may be illuminated from back surface 60 with energy 64. In another embodiment, as illustrated in FIG. 4, template 17 may be illuminated from active surface 62 with energy 64. Energy 64 may be provided from primary energy source 38 (shown in FIG. 1) and/or energy 64 may be provided from a secondary energy source. Energy 64 may be ultraviolet, thermal, electromagnetic, visible light, and/or other types of energy. In a further embodiment, energy may be provided from both primary energy source 38 (directed at surface 60) and a secondary energy source that produces energy 64 (directed at active surface 62). For example, energy may be provided from a primary energy source (UV source) and a secondary energy source (VUV). Energy may be provided substantially simultaneously and/or off-sync.

As illustrated in FIGS. 3 and 4, one or more nozzles 68 may be placed adjacent mask 20 of template 18. Nozzles 68 may provide fluid 66 to surfaces of template 18 and/or areas surrounding template 18. Fluid 66 may be any liquid or gas capable of substantially removing extrusions and/or particles from surfaces of template 18 and/or areas surrounding template 18. For example, fluid 66 may be an ozone gas. In one example, nozzles 68 may provide multiple fluids from one or more nozzles 68. For example, nozzles 68 may provide ozone gas, helium, carbon dioxide, and/or other substances needed during the imprinting process as described in relation to FIGS. 1 and 2.

Figure 5:
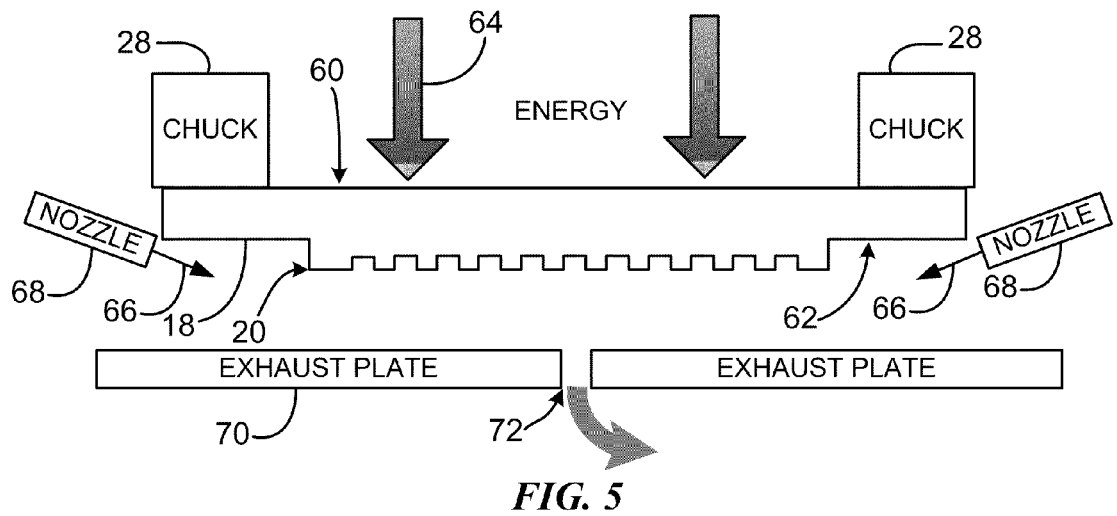
FIG. 5 illustrates a simplified side view of a system for removing contaminants from the template illustrated in FIG. 1.

In another embodiment, as illustrated in FIG. 5, spaced apart from template 18 may be an exhaust plate 70 having at least one port 72 for expelling excess fluid and/or contaminants. Exhaust plate 70 may be a flat or curved sheet of metal, plastic, glass, and/or similar material. In one example, port 72 may be located at a midpoint of plate 70. Port 72, however, may be located at any location along plate 70. Additionally, although only one port 72 is illustrated within FIG. 5, it should be noted that multiple ports 72 may be included within plate 70 to expel excess fluid 66 and/or contaminants.

Port 72 may provide an exhaust system for removal of fluid 66 from template 18 and area surrounding template 18. Port 72 may provide active expulsion through the use of a vacuum and/or other similar device operating by means of suction or force to remove fluid 66 from template 18 and area surrounding template 18. For example, vacuum and/or other similar device may further remove contaminants from fluid 66 for disposal and/or reuse.

Alternatively, port 72 may provide passive expulsion techniques. For example, fluid 66 (e.g., ozone) may be drawn across the template 18 attaching contaminants from template 18. Contaminants may be expelled with the fluid 66 and/or contaminants may be expelled through port 72.

Figure 6:
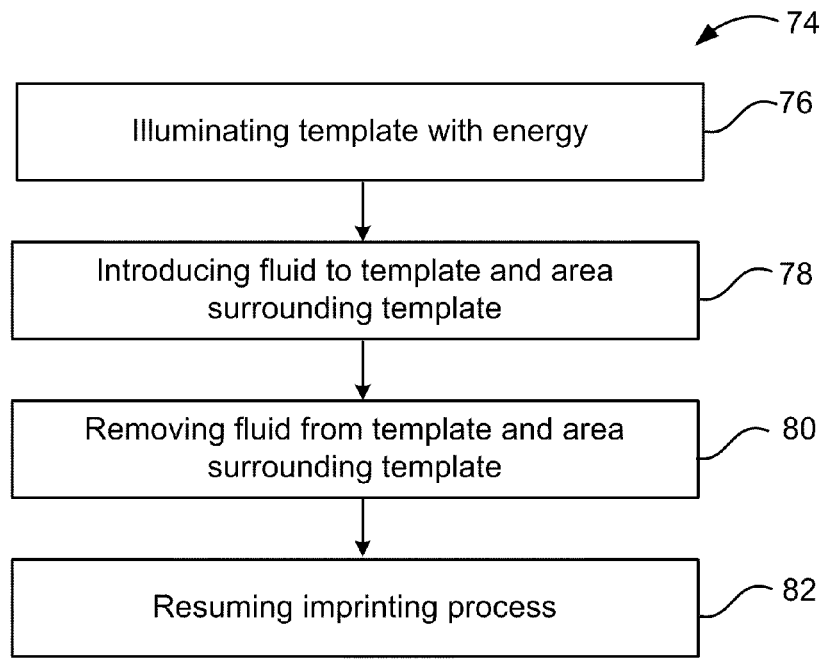
FIG. 6 illustrates a flow chart of an exemplary method for removing contaminants from a template.

FIG. 6 illustrates a flow chart 74 of an exemplary method for removing contaminants from template 18. In a step 76, template 18 may be illuminated with energy 64. Template 18 may be illuminated on back surface 60 and/or active surface 62. In a step 78, fluid 66 may be introduced to surfaces of template 18 and/or areas surrounding template 18. For example, fluid 66 may be introduced by nozzles 68. Fluid 66 may substantially remove contaminants from surfaces of template 18 and/or areas surrounding template 18. In a step 80, fluid 66 and/or contaminants may be removed from surface of template 18 and/or areas surrounding template 18. Removal of fluid 66 and/or contaminants may be through active expulsion and/or passive expulsion through port 72 and/or other similar mechanism. In a step 82, the imprinting process as described in relation to FIGS. 1 and 2 may be resumed. In one embodiment, template 18 may be cleaned while a first substrate 12 is unloaded and a second substrate is loaded in imprint lithography system 10.

In some embodiments, vacuum ultraviolet radiation (e.g., radiation in a wavelength range of about 120 nm to about 200 nm) may be used to clean features 24 and 26 and/or mask 20 of imprint lithography template 18 within imprint lithography system 10. Vacuum ultraviolet radiation, or VUV radiation, may be absorbed by oxygen (e.g., oxygen in the atmosphere) at wavelengths below about 200 nm. Non-UV-absorbing gaseous species include nitrogen and argon. Absorption of VUV radiation by oxygen may result in the production of reactive species such as ozone and/or excited atomic oxygen. These species may be reactive toward organic compounds, and as such, able to clean material 34 and/or solidified material 34 from surfaces of imprint lithography template 18. Generation of reactive oxygen species may be further increased by substantially simultaneous irradiation with a VUV source and with a UV source that produces radiation in a wavelength range of about 170 nm to 370 nm.

VUV radiation sources include, for example, low pressure mercury vapor lamps, dielectric barrier discharge sources, and the like. Low pressure mercury vapor lamps may produce radiation in more than one spectral region, including a band at about 185 nm that may generate ozone, and another band at about 254 nm that may be absorbed by some organic molecules and degrades them directly (without ozone). A dielectric barrier discharge (DBD) source that is filled with a rare gas (or a mixture of a rare gas and a halide) may produce vacuum ultraviolet radiation from excimer decay. This radiation source may be very efficient; for example, when a DBD source contains xenon gas, approximately 40 percent of the electrical energy may be converted into radiation at a wavelength of about 172 nm. DBD sources may operate at room temperature with negligible warm-up time and/or produce minimal heat.

In the absence of a purged chamber or an atmosphere of non-UV-absorbing gas, VUV radiation may be absorbed by oxygen proximate to the radiation source (e.g., within about 10 mm from the surface of the source). As such, a VUV radiation source that may be incorporated in imprint lithography system 10 in the absence of a purged chamber or an atmosphere of non-UV-absorbing gas may be positioned proximate template 18 during cleaning.

Figure 7:
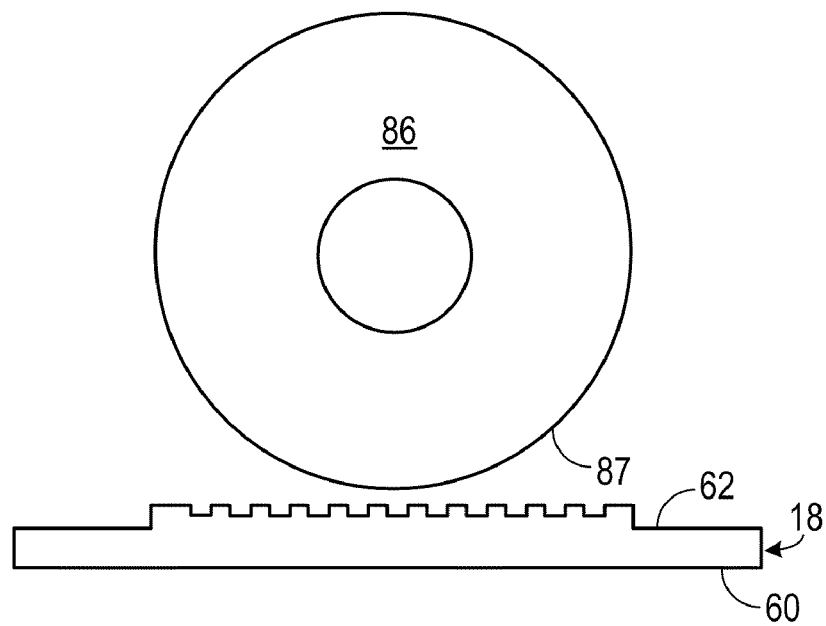
FIG. 7 illustrates a surface of a template proximate to an exemplary ultraviolet cleaning source.

Referring to FIG. 7, in some embodiments, template 18 may be cleaned while within imprint lithography system 10 (in-situ), at atmospheric pressure in an oxygen-containing environment (e.g., in air). For example, active surface 62 of the template 18 may be brought into close proximity to surface 87 of VUV radiation source 86 within an oxygen-containing environment. In some embodiments, the VUV radiation source 86 may be a DBD source. In one embodiment, active surface 62 of template 18 may be brought within approximately 10 mm of surface 87 of VUV radiation source 86. As such, radiation may strongly attenuated in air providing for efficient cleaning. Smaller separation distances may result in more intense irradiation of active surface 62 of template 18 and may further improve the rate at which organic compounds may be removed from active surface 62 of template 18. In some cases, the rate of cleaning may vary across active surface 62 of template 18 (e.g., radiation source 86 may be a bulb with a curved surface providing variations of energy across active surface 62 of template 18).

Figure 8:
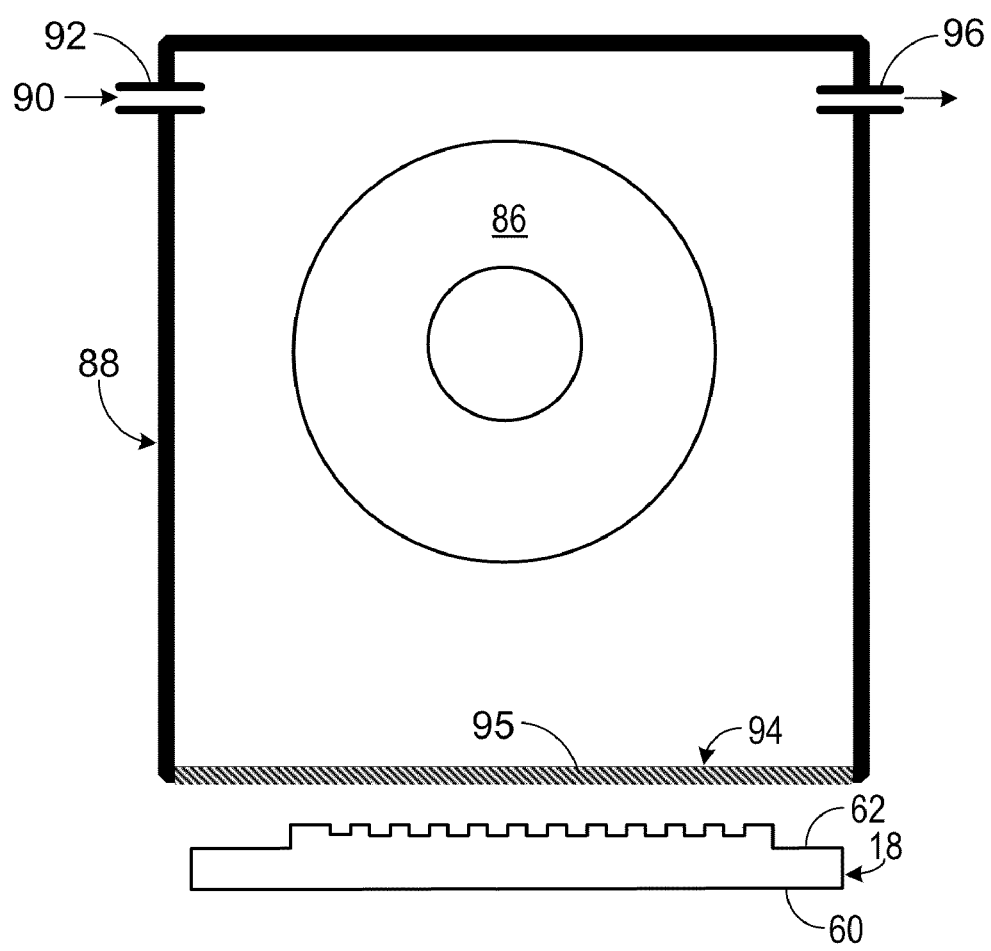
FIG. 8 illustrates an exemplary ultraviolet cleaning source housed in a chamber purged with a non-UV-absorbing gas.

FIG. 8 illustrates another embodiment wherein the VUV radiation source 86 may be housed in a chamber 88. In this figure, chamber 88 is shown positioned over template 60. It should be noted chamber 88 may be positioned above or below template 60 to provide radiation 64 as shown in FIGS. 3 and 4. Other relative positions of chamber 88 and template 60 also may be possible. Chamber 88 may be purged with a non-absorbing gas 90 (e.g., nitrogen or argon) through inlet 92. Pressure inside chamber 88 may be about atmospheric pressure. Template 18 may be placed in close proximity to (e.g., within about 5 mm of) window 94 of purged chamber 88. Window 94 may be constructed of materials including, but not limited to non-UV-absorbing material (e.g., fused silica). VUV radiation source 86 may irradiate a first side 95 (i.e. purged side) of window 94 with relatively high uniformity providing relatively uniform cleaning across active surface 62. As indicated in FIG. 8, gas 90 used to purge chamber 88 may also be used to remove the heat generated by VUV radiation source 86. For example, gas 90 may be used to remove heat through outlet 96.

Figure 9:
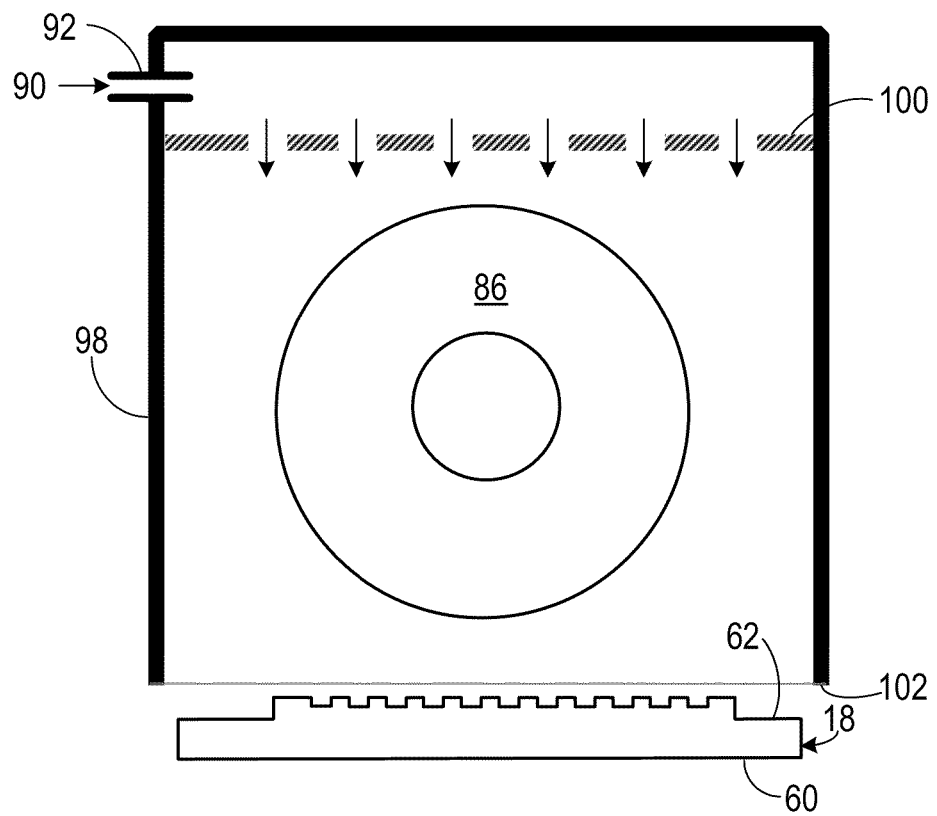
FIG. 9 illustrates an exemplary ultraviolet cleaning source in a chamber with flow of non-UV-absorbing gas from the ultraviolet source toward a template.

As illustrated in FIG. 9, VUV radiation source 86 (e.g., DBD source) may be positioned in an open chamber 98. Non-UV-absorbing gas 90 may flow into chamber 98 through inlet 92. Gas 90 may flow through diffuser plate 100 prior to flowing to VUV radiation source 86. A substantially laminar flow may be established in chamber 98 towards template 18. Active surface 62 of template 18 may be positioned within about 5 mm of opening 102 of chamber 98, such that a distance between active surface 62 of template 18 and VUV radiation source 86 may exceed 5 mm. Flow of non-UV-absorbing gas 90 may reduce attenuation of radiation from VUV radiation source 86 that may otherwise occur in air between VUV radiation source 86 and active surface 62 of template 18. This may provide for a greater distance between VUV radiation source 86 and active surface 62 of template 18 than achieved in air (e.g., as illustrated in FIG. 7).

Figure 10:
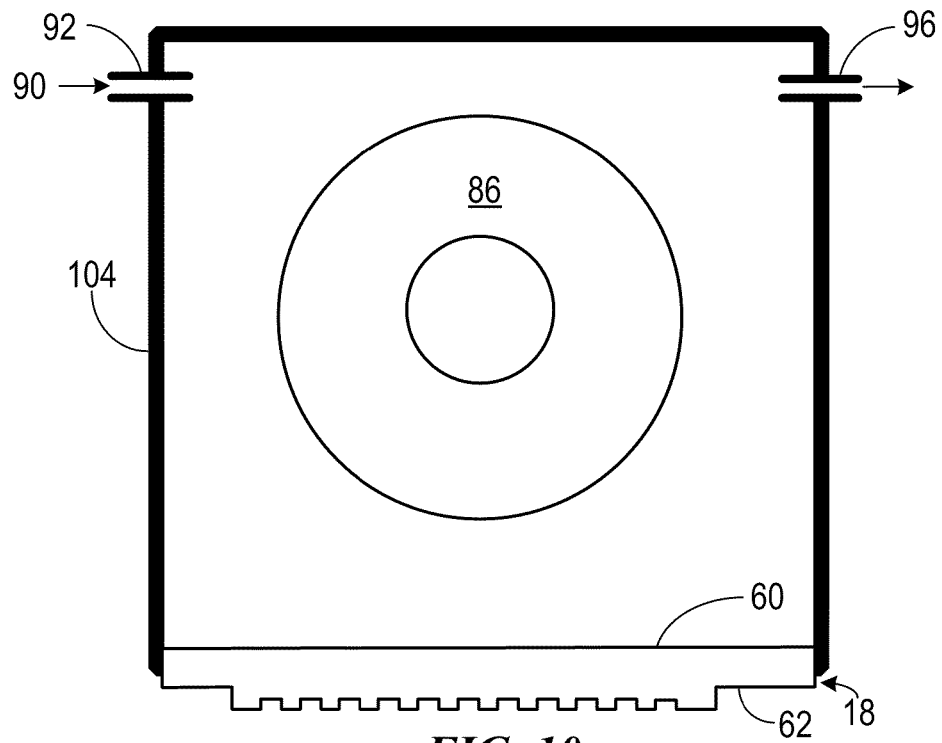
FIG. 10 illustrates an exemplary ultraviolet cleaning source in a purged chamber and proximate to a non-imprinting side of a template.

FIG. 10 illustrates another embodiment wherein VUV radiation source 86 (e.g., DBD source) may be positioned in a purged chamber 104. Template 18 may form one side of the chamber 104, with the active surface 62 of template 18 facing away from chamber 104. For example, active surface 62 may be in an air environment. VUV radiation may be transmitted through purged chamber 104 to back surface 60 of template 18, and further through to active surface 62 of template 18.

Radiation intensity at active surface 62 may be relatively high, resulting in improved rates of surface cleaning. For example, with VUV radiation source 86 positioned proximate to back surface 60 of template 18 (as opposed to being between template 18 and substrate 12), template 18 may be cleaned without substantial repositioning of VUV radiation source 86 and/or repositioning of template 18 within imprint lithography system 10 of FIG. 1. This configuration may provide active surface 62 of template 18 to be cleaned without positioning VUV radiation source 86 between template 18 and substrate 12 and/or stage 16 of FIG. 1. As such, template 18 may be cleaned subsequent to each imprint as described in relation to FIGS. 1 and 2.

Figure 11A:
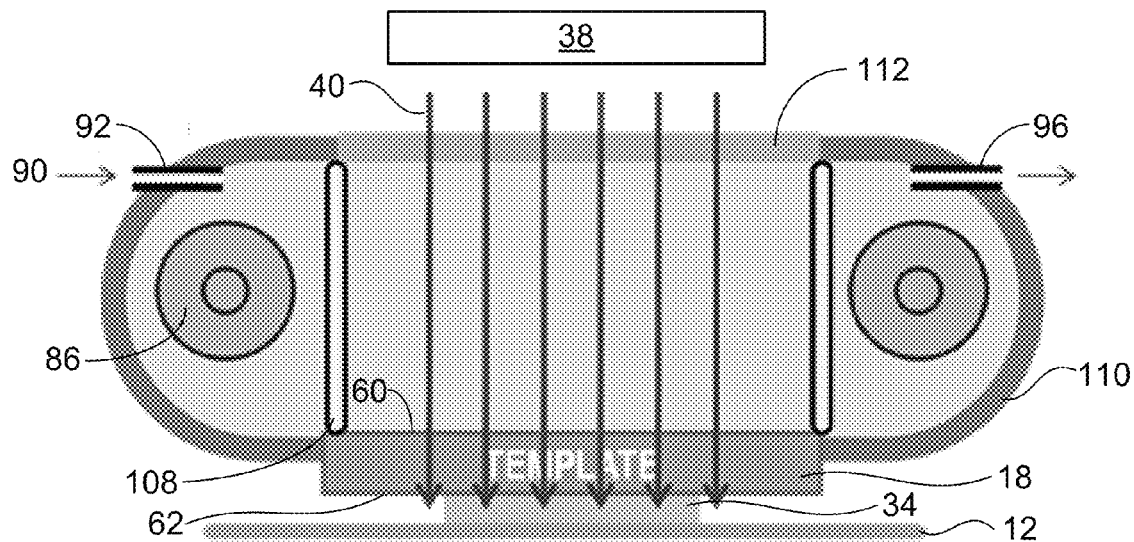
FIGS. 11A and 11B illustrate operation of an imprint lithography system having different ultraviolet sources for curing and cleaning.
Figure 11B:
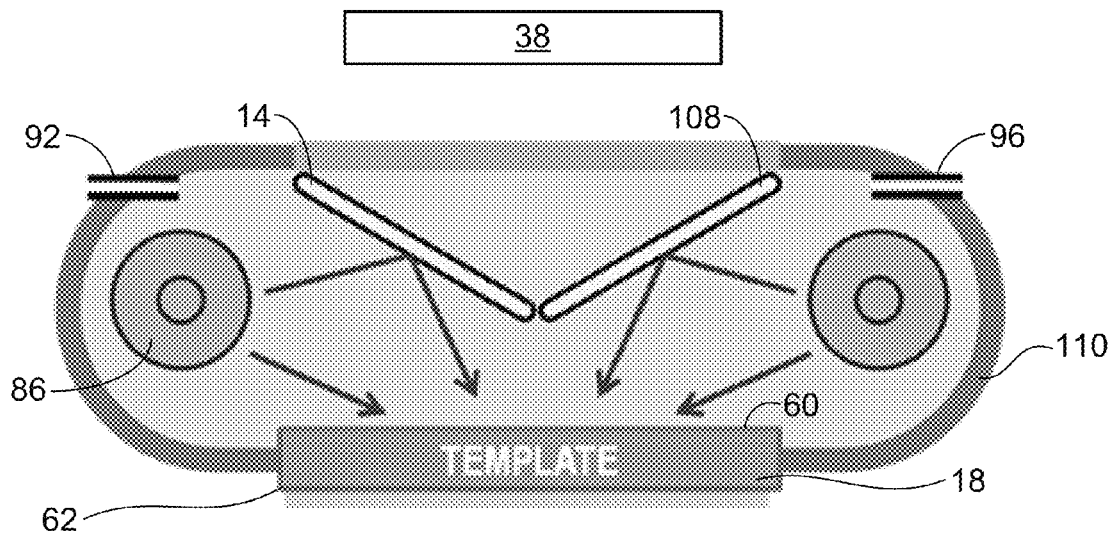

FIGS. 11A and 11B illustrate another embodiment having both energy source 38 and VUV radiation sources(s) 86 (e.g., DBD source). Energy source 38 may solidify material 34 between template 18 and substrate 12, and VUV radiation source(s) 86 may clean active surface 62 and/or back surface 60 of template 18.

FIG. 11A illustrates shutters 108 in an open position. In the open position, shutters 108 may facilitate energy 40 from energy source 38 entering chamber 110 through window 112 to irradiate material 34 between active surface 62 of template 18 and substrate 12. Chamber 100 may be purged with non-UV-absorbing gas 90.

FIG. 11B illustrates shutters 108 in a closed position. In the closed position, VUV radiation from VUV radiation source(s) 86 may contact back surface 60 of template 18. Shutters 108 may have reflective surface 114 to direct VUV radiation in chamber 110 towards template 18. Subsequent to cleaning of template 18, shutters 108 may be opened again to providing energy 40 from energy source 38 to reach template 18.

In some embodiments, shutters 108 may be transparent to energy 40 from energy source 38 and reflect VUV radiation. For example, shutters 108 may have a coating reflecting VUV radiation. In such embodiments, shutters 108 may remain stationary (e.g., as shown in FIG. 11B) for the solidifying step (e.g., polymerizing) as described in relation to FIGS. 1 and 2.

Figure 12A:
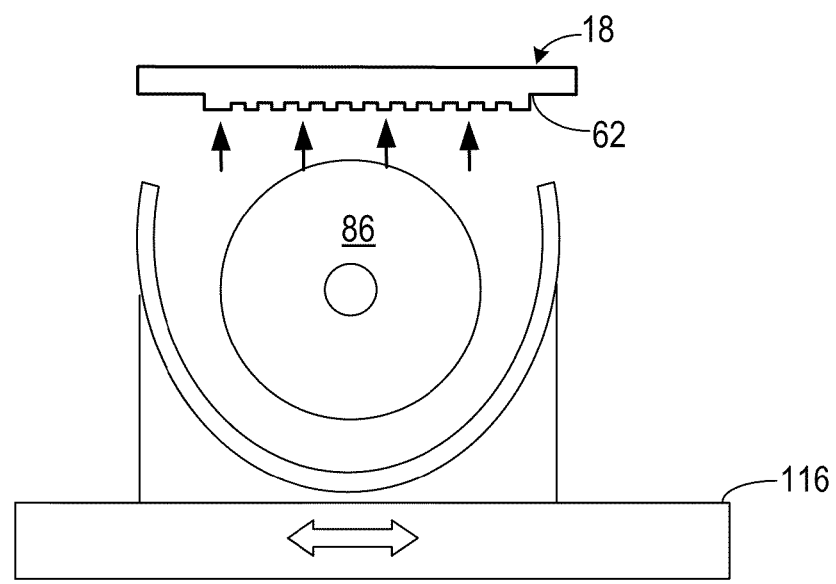
FIGS. 12A and 12B illustrate exemplary movement of an ultraviolet cleaning source mounted on a stage beneath an imprint lithography template.
Figure 12B:
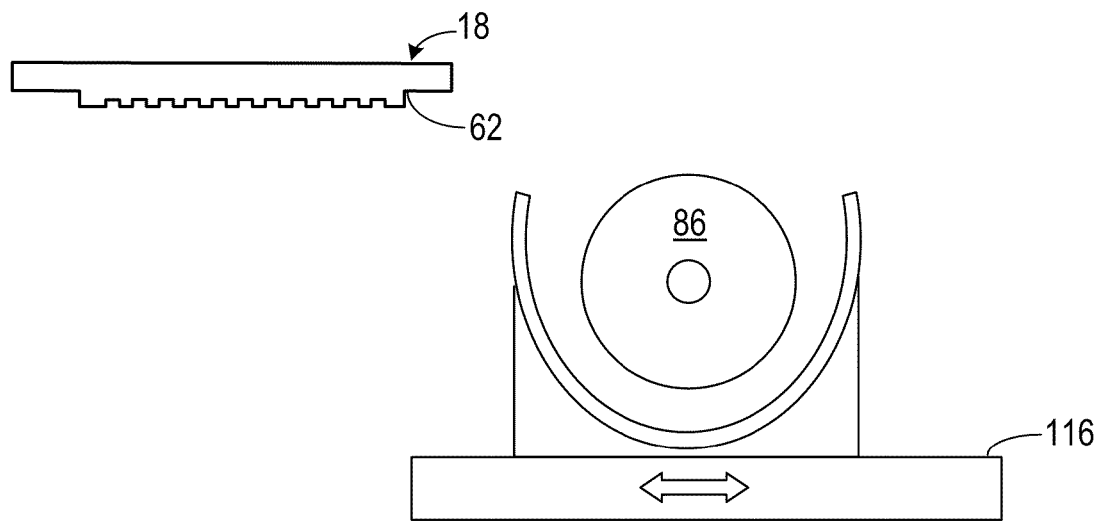

FIGS. 12A and 12B illustrated another embodiment wherein VUV radiation source 86 (e.g., a DBD source) may be coupled to a stage 116 (e.g., an x-y stage) positioned below active surface 62 of template 18. Stage 116 may be similar in design to transfer bodies describe in further detail in U.S. Ser. No. 10/438,224 and U.S. Ser. No. 11/211,766, which are both herein incorporated by reference in their entirety.

Referring to FIG. 12A, during a cleaning process, stage 116 may be translated and/or rotated to position one or more VUV radiation source(s) 86 beneath active surface 62 of template 18. Radiation from VUV radiation source 86 may be directed toward the active surface 62 of the template 18. Additionally, VUV radiation source 86 may be positioned beneath a portion of active surface 62 and stage 116 translated along x and y directions to provided radiation across active surface 62.

Referring to FIG. 12B, subsequent to cleaning, stage 116 may be translated and/or rotated to move VUV radiation source 86 such that VUV radiation source 86 may no longer be positioned below template 18. Template 18 and substrate 12 may be re-aligned for imprinting as described in relation to FIGS. 1 and 2.

Figure 13:
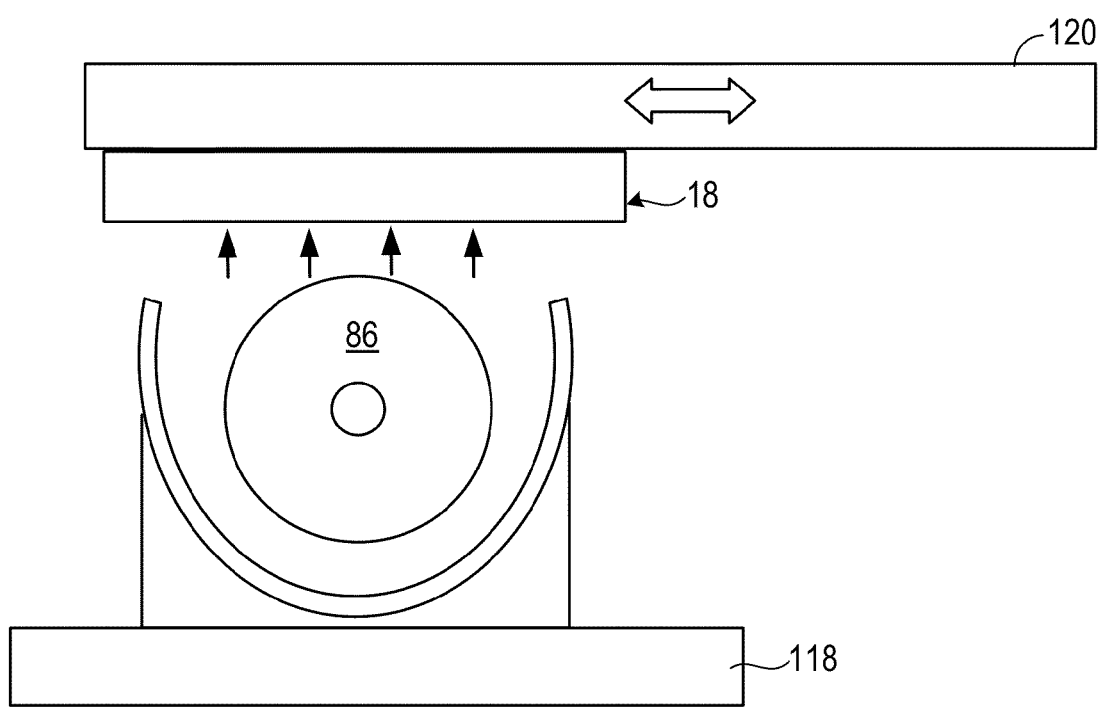
FIG. 13 illustrates an exemplary ultraviolet cleaning source mounted on a stationary fixture to provide cleaning of the template during loading and unloading of the substrate.

FIG. 13 illustrates another embodiment wherein template 18 may be cleaned as substrate 12 is loaded or unloaded from system 10. For example, VUV radiation source 86 (e.g., a DBD source), may be mounted on a stationary fixture 118, as shown in FIG. 13. An automated template handling tool 120 may be used to position template 18 proximate the VUV radiation source 86 for cleaning, and then reposition template 18 proximate to substrate 12 for imprinting as described in relation to FIGS. 1 and 2.

What is claimed is:

1. A method of cleaning an imprint lithography template in an imprint lithography system, the method comprising:
    irradiating a surface of the template with vacuum ultraviolet radiation from a vacuum ultraviolet radiation source while the template is arranged within the imprint lithography system
    wherein the vacuum ultraviolet radiation source is positioned in a chamber, and further comprising establishing a substantially laminar flow of non-UV-absorbing gas in the chamber flowing from the vacuum ultraviolet radiation source toward the template surface during the irradiating of the template surface.

2. The method of claim 1, wherein the vacuum ultraviolet radiation source comprises a dielectric barrier discharge source.

3. The method of claim 1, wherein irradiating the surface of the template includes irradiating an active surface of the template.

4. The method of claim 1, further comprising positioning the template proximate the vacuum ultraviolet radiation source prior to irradiating the template.

5. The method of claim 1, further comprising positioning the vacuum ultraviolet radiation source proximate the template prior to irradiating the template.

6. The method of claim 1, wherein the non-UV-absorbing gas is nitrogen or argon.

7. The method of claim 1, wherein a pressure in the chamber is greater than or substantially equal to atmospheric pressure.

8. The method of claim 1, further comprising loading or unloading a substrate in the imprint lithography system while irradiating the template.

9. The method of claim 1, wherein the template is coupled to a template chuck.

10. The method of claim 1, further comprising flowing gas over a surface of the template and exhausting the gas from the imprint lithography system to remove contaminants from the imprint lithography system.

11. The method of claim 6 wherein the non-UV absorbing gas is nitrogen.

12. The method of claim 6 wherein the non-UV absorbing gas is argon.

* * * * *